United States Patent
Higuchi et al.

(10) Patent No.: US 8,791,445 B2
(45) Date of Patent: Jul. 29, 2014

(54) INTERFACIAL OXIDE USED AS SWITCHING LAYER IN A NONVOLATILE RESISTIVE MEMORY ELEMENT

(75) Inventors: Randall Higuchi, San Jose, CA (US); Tony P. Chiang, Campbell, CA (US); Ryan Clarke, San Jose, CA (US); Vidyut Gopal, Sunnyvale, CA (US); Imran Hashim, Saratoga, CA (US); Robert Huertas, Hollister, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 69 days.

(21) Appl. No.: 13/409,436

(22) Filed: Mar. 1, 2012

(65) Prior Publication Data

US 2013/0228735 A1    Sep. 5, 2013

(51) Int. Cl.
*H01L 45/00* (2006.01)
*H01L 21/62* (2006.01)

(52) U.S. Cl.
USPC .............. 257/4; 257/E21.52; 257/E45.003; 438/181; 438/257; 438/382

(58) Field of Classification Search
USPC ................ 438/181, 257, 382, E47.005
See application file for complete search history.

(56) References Cited

U.S. PATENT DOCUMENTS

| | | | |
|---|---|---|---|
| 3,883,887 A | 5/1975 | Robinson, Sr. | |
| 5,810,923 A | 9/1998 | Yano | |
| 6,534,784 B2 | 3/2003 | Eliasson et al. | |
| 8,106,377 B2 | 1/2012 | Noshiro | |
| 8,318,572 B1* | 11/2012 | Shanker et al. | 438/381 |
| 2002/0095756 A1* | 7/2002 | Park et al. | 29/25.42 |
| 2005/0186736 A1* | 8/2005 | Joo | 438/257 |
| 2006/0171200 A1 | 8/2006 | Rinerson et al. | |
| 2006/0263289 A1 | 11/2006 | Heo et al. | |
| 2008/0200003 A1 | 8/2008 | Hong | |
| 2010/0083487 A1 | 4/2010 | Noshiro | |
| 2010/0167463 A1* | 7/2010 | Sung | 438/104 |
| 2010/0258782 A1* | 10/2010 | Kuse et al. | 257/4 |
| 2011/0038196 A1* | 2/2011 | Tour et al. | 365/148 |
| 2011/0315945 A1* | 12/2011 | Kajigaya | 257/4 |
| 2013/0065377 A1* | 3/2013 | Gopal et al. | 438/382 |
| 2013/0221317 A1* | 8/2013 | Pramanik et al. | 257/5 |

FOREIGN PATENT DOCUMENTS

| | | |
|---|---|---|
| EP | 2099070 A1 | 9/2009 |
| EP | 2099071 A1 | 9/2009 |
| EP | 2099072 A1 | 9/2009 |

OTHER PUBLICATIONS

Inoue et al.; Nonpolar resistance switching of metalbinarytransitionmetal oxidesmetal sandwiches homogenousinhomogenous transition of current distribution; Jan. 1, 2008; National Institute of Advanced Industrial Science and Technology, Japan; Phys. Rev. B 77 035105 2008.

Lee et al.; Low Power Switching of Nonvolatile Resistive Memory Using Hafnium Oxide; Apr. 24, 2007; The Japan Society of Applied Physics; Japanese Journal of Applied Physics pp. 21752179 vol. 46 No. 4B.

(Continued)

*Primary Examiner* — Matthew W Such
*Assistant Examiner* — David Spalla

(57) ABSTRACT

A nonvolatile resistive memory element includes a host oxide formed from an interfacial oxide layer. The interfacial oxide layer is formed on the surface of a deposited electrode layer via in situ or post-deposition surface oxidation treatments.

20 Claims, 6 Drawing Sheets

(56) References Cited

OTHER PUBLICATIONS

Smyth; The defect chemistry or metal oxides; Jan. 1, 2000; Z—Book-Author; Chapters 15 8 9 and 12 pp. 174 118161 and 217237.

Sanchez, MJ., et al.; A Mechanism for Unipolar Resistance Switching in Oxide Nonvolatile Memory Devices; Jan. 1, 2007; Universidad De Buenes Aires; Applied Physics Letters 912521012007 American Institute of Physics.

Baek, I.G., et al.; MultiLayer CrossPoint Binary Oxide Resistive Memory OxRRAM for PoastNAND Storage Application; Jan. 1, 2005; Samsung Electronics Co., Ltd.

Seo, S., et al.; Resistance Switching Mechanism of MetalOxideMetal Structure NiO; ; Samsung Electronics Co., Ltd.; Presentation of Samsung undated.

Chun, Z., et al.; Improvement of RCA Transistor Using RTA Annealing After the Formation of Interfacial Oxide; Jun. 1, 2002; Peking University; IEEE Transactions on Electron Devices vol. 49 No. 6 pp. 10751076.

Choi, K., et al.; Initial Growth of Interfacial Oxide During Deposition of HfO2 on Silicon; Jul. 12, 2004; Texas Tech University; Applied Physics Letters vol. 85 No. 2 pp. 215218.

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

\* cited by examiner

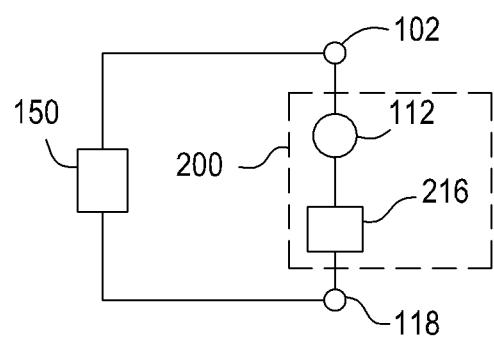
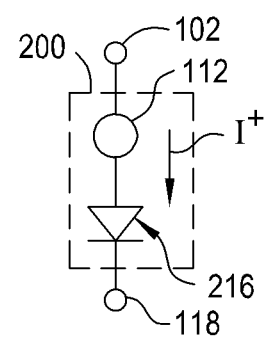
FIG. 2A          FIG. 2B
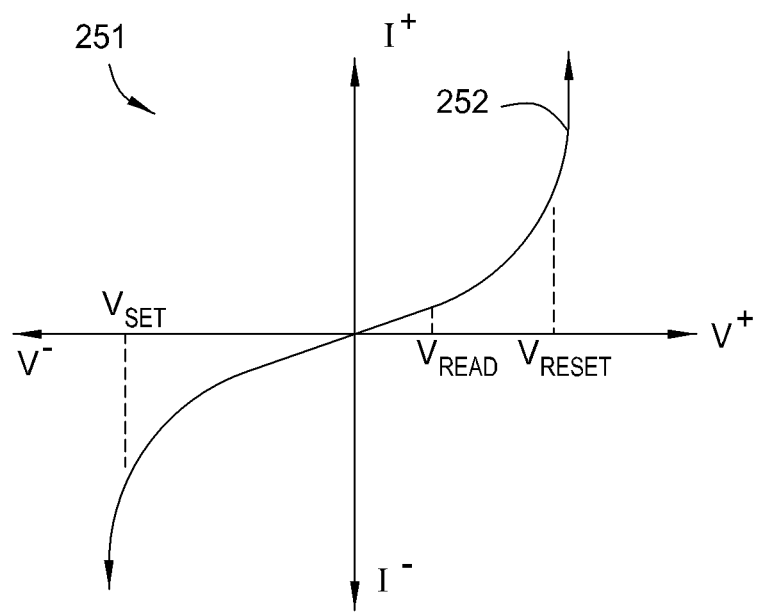
FIG. 3

INTERFACIAL OXIDE USED AS SWITCHING LAYER IN A NONVOLATILE RESISTIVE MEMORY ELEMENT

BACKGROUND

1. Field of the Invention

This invention relates to nonvolatile resistive memory elements, and more particularly, to the use of an interfacial oxide as a switching layer in a nonvolatile resistive memory element.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive-switching-based nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit that is stored therein.

As resistive switching memory device sizes shrink, it is important to reduce the required currents and voltages that are necessary to reliably set, reset and/or determine the desired "on" and "off" states of the device, thereby minimizing power consumption of the device, resistive heating of the device, and cross-talk between adjacent devices. In addition, the formation of resistive switching memory devices having suitably small dimensions is a complicated process, requiring a number of different and specialized deposition systems, such as atomic layer deposition and physical vapor deposition systems.

In light of the above, there is a need in the art for nonvolatile resistive switching memory devices having reduced current and voltage requirements that can be easily manufactured.

SUMMARY

Embodiments of the invention set forth a nonvolatile resistive memory element that includes a host oxide comprising an interfacial oxide layer and methods of forming the same. The interfacial oxide layer is an oxide layer formed on the surface of a deposited electrode layer via in situ or post-deposition surface oxidation treatments. The switching performance of a memory device based on such an interfacial oxide layer is equivalent or superior to the performance of a conventional resistive memory element.

According to one embodiment of the present invention, a nonvolatile memory element comprises a first layer operable as an electrode layer, an interfacial oxide layer formed on a surface of the first layer by an oxidation treatment of the surface, and a second layer operable as an electrode layer formed above the interfacial oxide layer.

According to another embodiment of the present invention, a method of forming a nonvolatile memory element includes the steps of forming a first layer operable as an electrode layer of the nonvolatile memory element, forming an interfacial oxide layer on a surface of the first layer by treating the surface of the first electrode layer with an oxidation treatment, and depositing a second layer above the interfacial oxide layer, wherein the second layer is operable as an electrode layer of the nonvolatile memory element.

BRIEF DESCRIPTION OF THE DRAWINGS

So that the manner in which the above recited features of embodiments of the invention can be understood in detail, a more particular description of embodiments of the invention, briefly summarized above, may be had by reference to the appended drawings. It is to be noted, however, that the appended drawings illustrate only typical embodiments of this invention and are therefore not to be considered limiting of its scope, for the invention may admit to other equally effective embodiments.

FIG. 2A is a schematic cross-sectional view of a memory device, configured in accordance with an embodiment of the invention.

FIG. 2B schematically illustrates a memory device configured to allow current to flow through the memory device in a forward direction, according to embodiments of the invention.

FIG. 3 sets forth a log-log plot of current versus voltage of a bipolar switching curve for one embodiment of a memory element, according to an embodiment of the invention.

For clarity, identical reference numbers have been used, where applicable, to designate identical elements that are common between figures. It is contemplated that features of one embodiment may be incorporated in other embodiments without further recitation.

DETAILED DESCRIPTION

Materials used as the switching layer of a nonvolatile resistive memory element are generally required to have bistable properties and can be operated with low switching current. Embodiments of the invention set forth a nonvolatile memory element with a novel variable resistance layer and methods of forming the same. The novel variable resistance layer includes a host oxide that is formed from an interfacial oxide and operates with reduced switching voltage and current. The interfacial oxide layer is an oxide layer that may be formed on the surface of a deposited electrode layer via in situ or post-deposition surface oxidation treatments.

Figure 1:
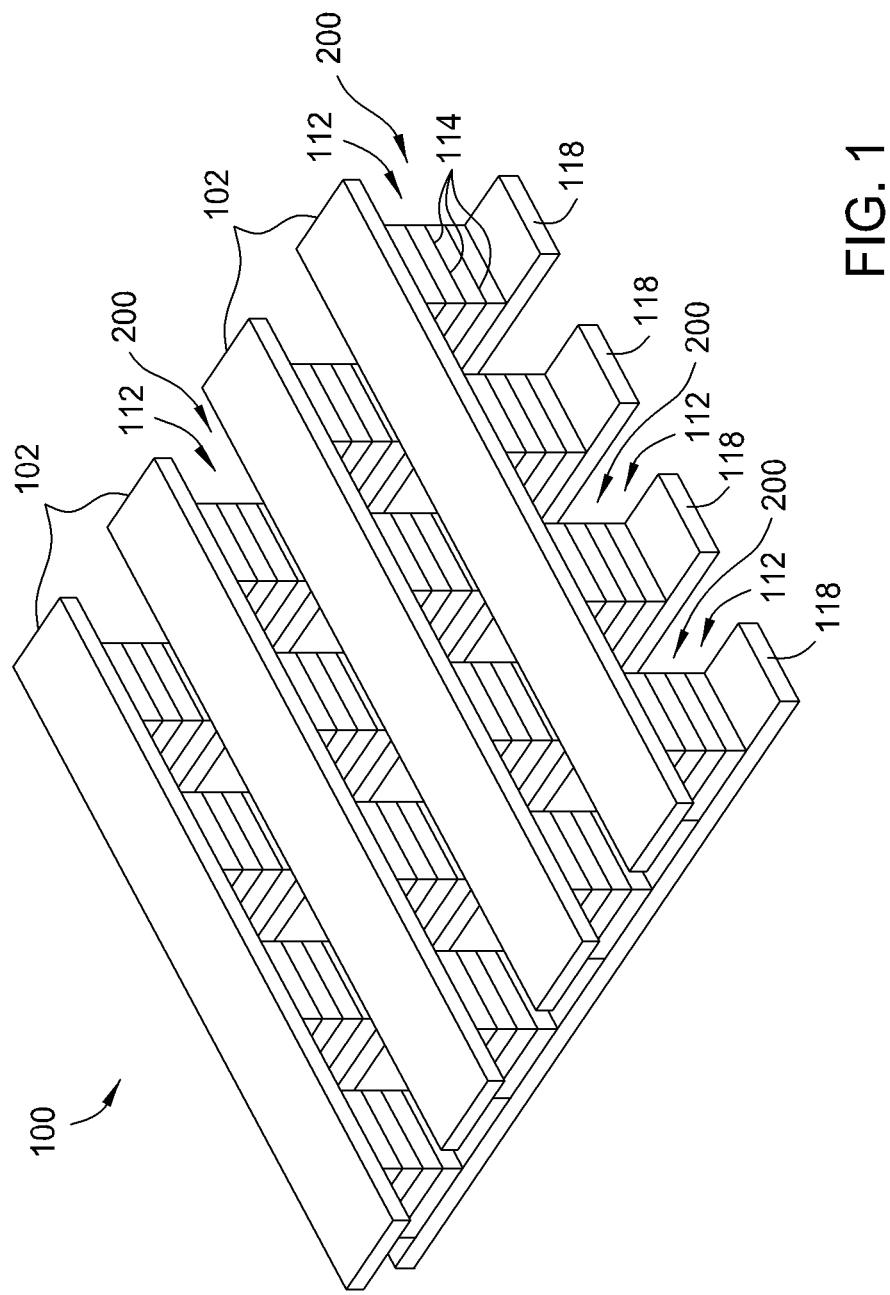
FIG. 1 is a perspective view of a memory array of memory devices, configured according to embodiments of the invention.

FIG. 1 is a perspective view of a memory array 100 of memory devices 200, configured according to embodiments of the invention. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, handheld computers, and music players. For clarity, memory array 100 is illustrated as a single layer memory array structure. However, memory arrays such as memory array 100 can also be stacked in a vertical fashion to make multilayer memory array structures.

Each of memory devices 200 comprises a nonvolatile resistive switching memory device, such as a resistive random access memory (ReRAM) device. Memory device 200 comprises a novel memory element 112 that may be formed from one or more material layers 114. Material layers 114 include a novel variable resistance layer comprising an interfacial oxide, which is described below in conjunction with FIG. 4. In some embodiments, memory device 200 also includes a current steering device, which is described below in conjunction with FIGS. 2A, 2B.

Read and write circuitry (not shown) is connected to memory devices 200 using electrodes 102 and electrodes 118. Electrodes 102 and electrodes 118, which are sometimes referred to as "bit lines" and "word lines," and are used to read and write data into memory elements 112 in memory devices 200. Individual memory devices 200 or groups of memory devices 200 can be addressed using appropriate sets of electrodes 102 and electrodes 118.

FIG. 2A is a schematic diagram of a memory device 200 configured in accordance with an embodiment of the invention. Memory device 200 includes memory element 112 and in some embodiments current steering device 216, which are both disposed between electrodes 102 and electrodes 118. In one embodiment, current steering device 216 comprises an intervening electrical component, such as a p-n junction diode, p-i-n diode, transistor, or other similar device that is disposed between electrode 102 and memory element 112, or between electrode 118 and memory element 112. In some embodiments, current steering device 216 may include two or more layers of semiconductor material, such as two or more doped silicon layers, that are configured to allow or inhibit the current flow in different directions through the memory element 112. In addition, read and write circuitry 150 is coupled to memory device 200 via electrodes 102 and electrodes 118 as shown. Read and write circuitry 150 is configured to both sense the resistance state and set the resistance state of memory device 200.

FIG. 2B schematically illustrates memory device 200 configured to allow current to flow through memory device 200 in a forward direction ("I+"), according to embodiments of the invention. However, due to the design of current steering device 216, a reduced current can also flow in the opposing direction through the device by the application of a reverse bias to electrodes 102 and electrodes 118.

During a read operation, read and write circuitry 150 applies a read voltage $V_{READ}$, e.g., +0.5 volts (V), across resistive switching memory element 112 using an appropriately selected electrode 102 and electrode 118 in memory array 100. Read and write circuitry 150 then senses the resultant current passing through memory device 200. A relatively high "on" current value indicates that memory element 112 is in its low resistance state, and a relatively low "off" current value indicates that memory element 112 is in its high resistance state. Depending on its history, the particular memory element 112 that is addressed in this way may be in either a high resistance state (HRS) or a low resistance state (LRS). The resistance of memory element 112 therefore determines what digital data is being stored therein. For example, if memory element 112 is in the high resistance state, memory element 112 may be said to contain a logical zero (i.e., a "0" bit). If, on the other hand, memory element 112 is in the low resistance state, memory element 112 may be said to contain a logical one (i.e., a "1" bit).

During a write operation, the resistive state of a particular memory element 112 in memory array 100 is changed by application of suitable write signals to an appropriate set of electrodes 102 and electrodes 118 by read and write circuitry 150. In some embodiments, to affect such a change, bipolar switching is used, where opposite polarity "set" and "reset" voltages are used to alter the resistance of a selected memory element 112 between high and low resistance states. FIG. 3 sets forth a log-log plot 251 of current (I) versus voltage (V) of a bipolar switching curve 252 for one embodiment of memory element 112, and thus illustrates typical threshold values used to set and reset the contents of memory element 112. For example, memory element 112 may initially be in a high resistance state (e.g., storing a logical "zero"). To store a logical "one" in memory element 112, memory element 112 is placed into its low-resistance state. This may be accomplished by using read and write circuitry 150 to apply a "set" voltage $V_{SET}$ (e.g., −2 V to −4 V) across electrodes 102 and electrodes 118 so that a "set" current passes through memory element 112. In one embodiment, applying a negative $V_{SET}$ voltage to memory element 112 causes memory element 112 to switch to its low resistance state. In this region, the memory element 112 is changed so that, following removal of the "set" voltage $V_{SET}$, memory element 112 is characterized by a low resistance state. Conversely, to store a logical "zero" in memory element 112, the memory element can once again be placed in its high resistance state by applying a positive "reset" voltage $V_{RESET}$ (e.g., +2 V to +5 V) across memory element 112, so that a "reset" current passes through memory element 112. When read and write circuitry 150 applies $V_{RESET}$ to memory element 112, memory element 112 enters its high resistance state. When "reset" voltage $V_{RESET}$ is removed from memory element 112, memory element 112 will once again be characterized by high resistance when read voltage $V_{READ}$ is applied. While the discussion of the memory element 112 herein primarily provides bipolar switching examples, some embodiments of the memory elements 112 may use unipolar switching, where the "set" and "reset" voltages have the same polarity, without deviating from the scope of the invention described herein.

In an effort to prepare the memory element 112 for use, it is common to apply a forming voltage $V_{FORM}$ at least once across electrodes 102 and electrodes 118 to "burn-in" each memory device 200 of memory array 100. It is believed that the application of forming voltage $V_{FORM}$, which is typically significantly greater than the $V_{RESET}$ and $V_{SET}$ voltages, causes the defects that are formed within a variable resistance layer 206 (illustrated in FIG. 4) during the device fabrication process to move, align and/or collect within various regions of the layer, causing variable resistance layer 206 to consistently and reliably switch between the "on" and "off" resistive states throughout the memory element's life. In one embodiment, forming voltage $V_{FORM}$ is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form memory element 112 so that the application of a forming voltage is not required at all to assure that the device will perform as desired throughout its life.

It is believed that the change in the resistive state of the memory element 112 may be "trap-mediated" (i.e., changes in resistive state are due to the redistribution or filling of traps or defects in a variable resistance layer of memory element 112 when memory device 200 is reverse biased). When the variable resistance layer comprises a metal oxide, which is sometimes referred to as a host oxide, the defects or traps are generally thought to be oxygen vacancies formed during the deposition and/or the initial "burning-in" (or "forming") of the variable resistance layer. Various embodiments of the invention are provided in which a host oxide material of a variable resistance layer is formed from an interfacial oxide layer formed on a surface of a previously deposited electrode layer of memory element 112. Such a variable resistance layer has been shown to be more amenable to switching than prior art variable resistance layers that are deposited as an additional layer in a resistive memory element.

Figure 4:
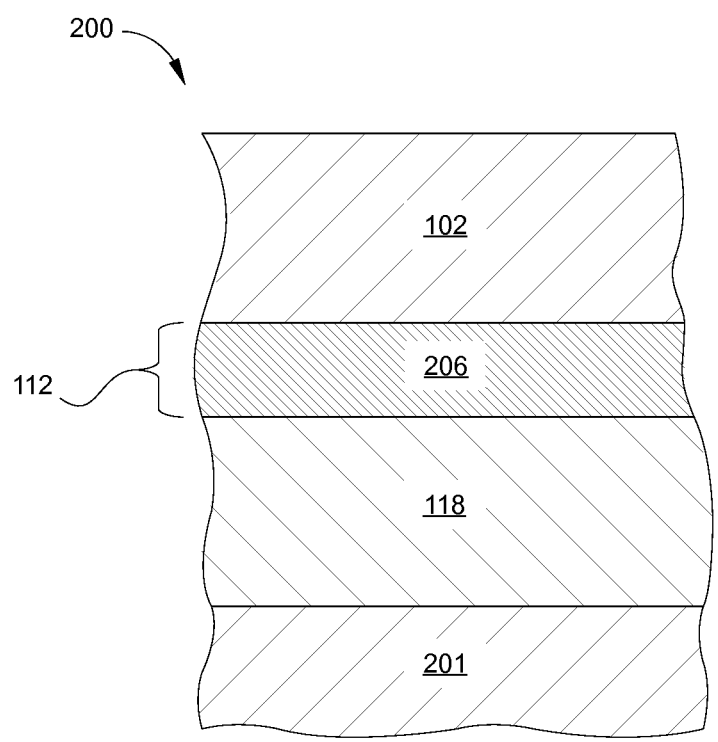
FIG. 4 is a schematic cross-sectional view of a memory device formed from a series of deposited layers, including a novel variable resistance layer, according to embodiments of the invention.

FIG. 4 is a schematic cross-sectional view of memory device 200 formed from a series of deposited layers, including a novel variable resistance layer 206, according to embodiments of the invention. In the embodiment illustrated in FIG. 4, memory device 200 is formed over, or integrated with and disposed over, portions of a surface of a substrate 201 (e.g., a silicon substrate or an SOI substrate). It is noted that relative directional terms used herein with regard to embodiments of the invention are for purposes of description only, and do not limit the scope of the invention. Specifically, directional terms such as "over," "above," "under," and the like are used under the assumption that substrate 201 on which embodiments are formed is a "bottom" element and is therefore "under" elements of the invention formed thereon.

In the embodiment illustrated in FIG. 4, memory device 200 comprises a memory element 112 disposed between electrodes 102 and 118. Memory element 112 is a nonvolatile resistive memory element that includes variable resistance layer 206. In other embodiments, memory device 200 further comprises an optional intermediate electrode and optional current steering device 216 (illustrated in FIGS. 2A, 2B) disposed between electrode 118 and variable resistance layer 206.

Electrodes 102 and 118 are formed from conductive materials that have a desirable work function tailored to the bandgap of the material making up variable resistance layer 206. In some configurations, electrodes 102 and 118 are formed from different materials so that electrodes 102 and 118 have a work function that differs by a desired value, e.g., 0.1 eV, 0.5 eV, 1.0 eV, etc. For example, in one embodiment, electrode 102 is comprised of TiN, which has a work function of 4.5-4.6 eV, while electrode 118 is comprises of n-type polysilicon, which has a work function of approximately 4.1-4.15 eV. In addition, electrode 118 is formed from a material that readily oxidizes, thereby facilitating the formation of an interfacial oxide for variable resistance layer 206. Materials suitable for use in electrode 118 include any variety of doped polysilicon (e.g., p-type polysilicon and n-type polysilicon), titanium nitride (TiN), tantalum nitride (TaN), transition metals (e.g., titanium (Ti), tantalum (Ta)), and transition metal alloys.

Materials suitable for use in electrode 102 include p-type polysilicon, n-type polysilicon, transition metals, transition metal alloys, transition metal nitrides, transition metal carbides, molybdenum oxide ($MoO_2$), iridium oxide ($IrO_2$), ruthenium oxide ($RuO_2$, $RuO_4$), tungsten oxide (WO), niobium nitride (NbN), and tantalum silicon nitride. In some embodiments, electrode 102 is a metal, metal alloy, metal nitride or metal carbide formed from an element selected from a group of materials consisting of titanium, tungsten (W), tantalum, cobalt (Co), molybdenum (Mo), nickel, vanadium (V), hafnium (Hf) aluminum (Al), copper (Cu), platinum (Pt), palladium (Pd), iridium (Ir), ruthenium, zirconium (Zr), and combinations thereof.

In some embodiments, electrode 102 includes one or more chemical elements that are incorporated into an interfacial oxide layer (formed on electrode 118) that forms variable resistance layer 206. These chemical elements are incorporated into the interfacial oxide layer after a thermal anneal process, and can significantly enhance the switching properties of variable resistance layer 206. Suitable chemical elements that may be included in electrode 102 for subsequent incorporation into the interfacial oxide layer formed on electrode 118 include transition metals such as titanium and tantalum, transition metal alloys, and nitrogen (N).

Variable resistance layer 206 comprises a dielectric material that can be switched between two or more stable resistive states. The dielectric material is formed from an interfacial oxide that operates with reduced switching voltage and current, and is disposed between electrodes 102 and 118 as shown in FIG. 4. In some embodiments, variable resistance layer 206 has a thickness up to about 100 Å and comprises an interfacial oxide formed from material on the top surface of electrode 118. For example, when electrode 118 comprises polysilicon, variable resistance layer 206 comprises the interfacial silicon oxide ($SiO_x$) formed from electrode 118. Methods of forming such an interfacial oxide and variable resistance layer 206 are described below in conjunction with FIG. 5. In some embodiments, variable resistance layer 206 comprises a naturally occurring interfacial oxide or an interfacial oxide formed by a chemical treatment (described below), and is relatively thin, i.e., 20 Å or less. In other embodiments, variable resistance layer 206 comprises an interfacial oxide that is formed with additional treatments and is substantially thicker, (i.e., up to 100 Å).

Figure 5:
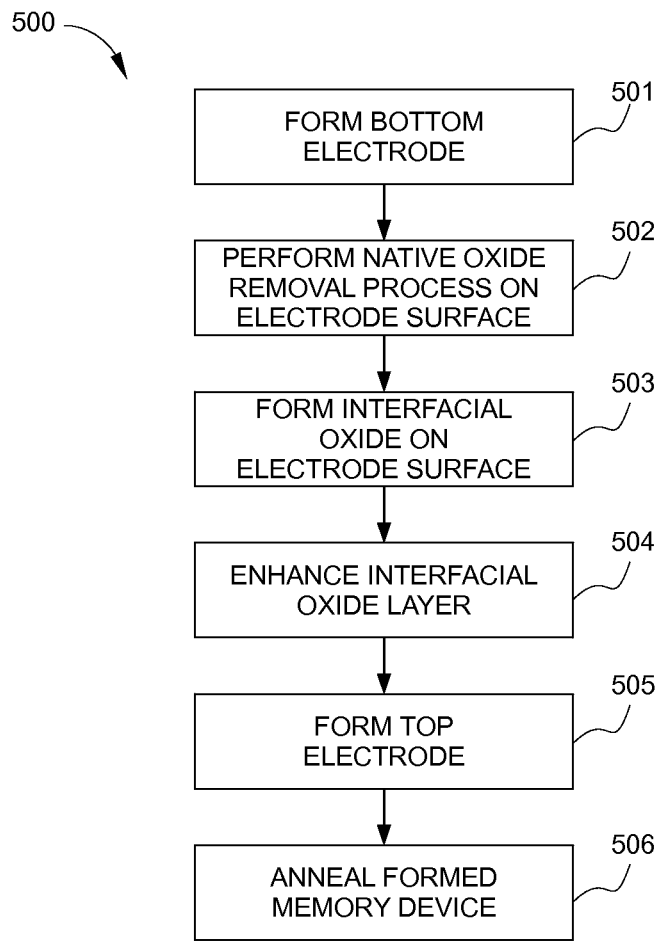
FIG. 5 sets forth a flowchart of method steps in a process sequence for forming a memory device, according to embodiments of the invention.

FIG. 5 sets forth a flowchart of method steps in a process sequence 500 for forming memory device 200, according to embodiments of the invention. FIGS. 6A-6F sequentially illustrate cross-sectional views of memory device 200 during the execution of process sequence 500, according to embodiments of the invention. Although the method steps are described in conjunction with memory device 200 in FIG. 4, persons skilled in the art will understand that formation of other resistive switching memory devices using process sequence 500 is within the scope of the invention.

As shown, method 500 begins at step 501, in which electrode 118 (illustrated in FIG. 6A) is formed on substrate 201 using one or more of the materials listed above in conjunction with FIG. 4. In one embodiment, electrode 118 is a highly doped polysilicon layer that is formed on substrate 201 using a conventional CVD polysilicon deposition technique. In one embodiment, electrode 118 is between about 50 and about 5000 Å thick.

In step 502, a native oxide removal process is performed on the top surface of electrode 118 to remove a native oxide layer 601 (illustrated in FIG. 6B) that generally forms on freshly deposited materials, such as electrode 118. Native oxide layer 601 is typically formed when electrode 118 is exposed to air when removed from a deposition chamber. When electrode 118 comprises polysilicon, native oxide layer 601 can be a layer of silicon oxide that is relatively thin (i.e., on the order of a few angstroms). In some embodiments, the formation of an interfacial oxide on electrode 118 (described below in step 503) is performed without exposing electrode 118 to atmospheric oxygen. In such embodiments, the native oxide removal process of step 502 may not be performed.

Figure 6A:
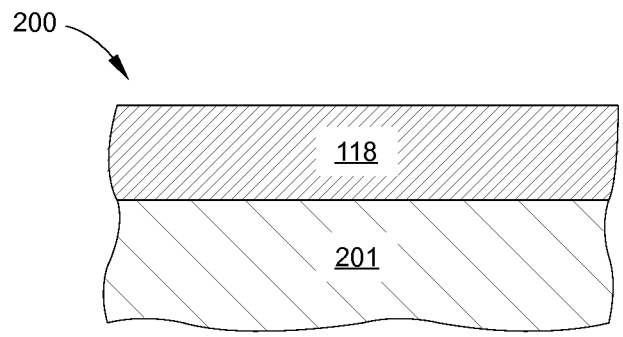
FIGS. 6A-6F sequentially illustrate cross-sectional views of a memory device during the execution of the process sequence set forth in FIG. 5, according to embodiments of the invention.
Figure 6B:
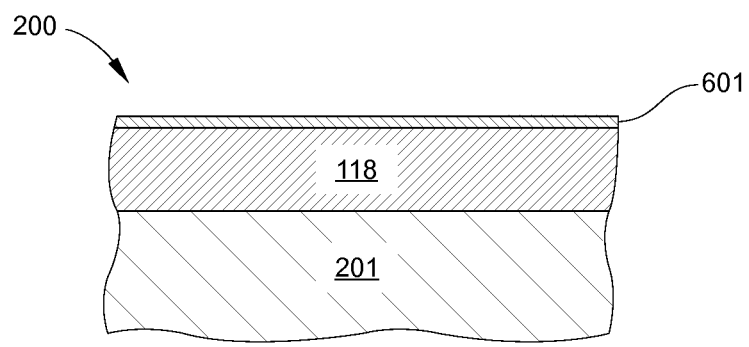
Figure 6C:
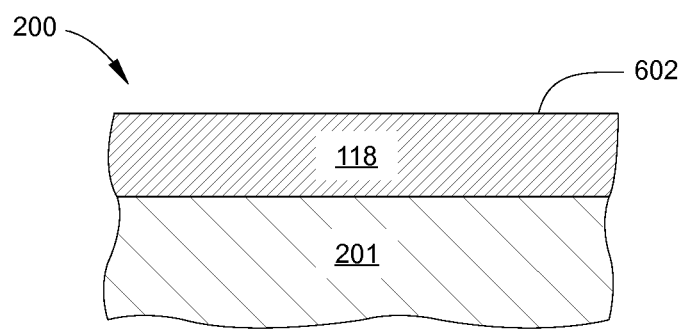

Various native oxide removal techniques known in the art may be employed in step 502 to remove native oxide layer 601 and expose surface 602 of electrode 118 (illustrated in FIG. 6C). Suitable wet cleaning techniques for the removal of native oxide layer 601 include application of a hydrofluoric (HF) acid solution and the oxide removal portion of the so-called "RCA clean" process, which is well-known in the art. Other suitable native oxide removal techniques include exposing native oxide layer 601 to a hydrofluoric acid-containing vapor and plasma etching native oxide layer 601 in a vacuum chamber. Process parameters of each of these removal techniques, such as temperature, duration, and concentration of removal agents, are contingent on the thickness and chemical make up of native oxide layer 601, and can be readily determined by one of skill in the art.

Figure 6D:
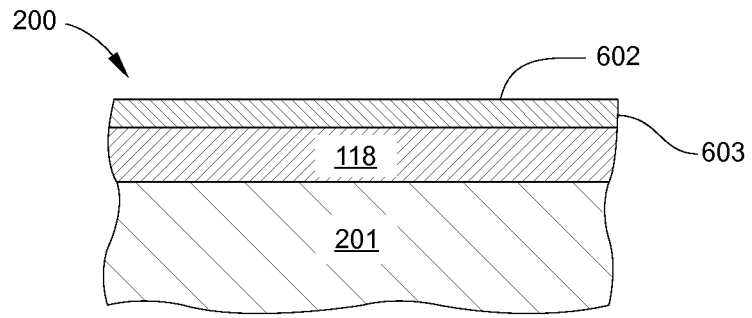
Figure 6E:
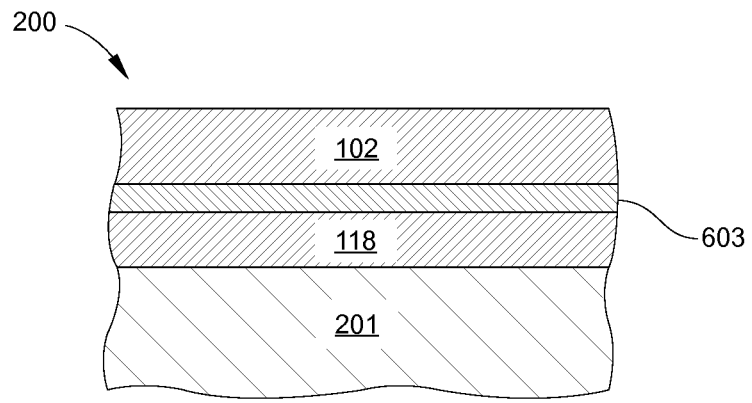

In step 503, an oxidation treatment is performed on surface 602 of electrode 118 to form interfacial oxide layer 603 from electrode 118 (illustrated in FIG. 6D). Because native oxide layer 601 is removed in step 502, the thickness of interfacial oxide layer 603 formed in step 503 can be precisely controlled. Various oxidation treatments known in the art are suitable for use in step 503 and are now described.

In some embodiments, a suitable oxidation treatment comprises exposure of surface 602 to an oxygen-containing gas under controlled conditions for a predetermined time period. Because temperature, oxygen concentration, and duration of the process are controlled, the resultant thickness and material properties of interfacial oxide layer 603 are known. In some embodiments, standard temperature air is used for the oxygen-containing gas, and in other embodiments, a mixture of air and supplemental oxygen is used as the oxygen-containing gas. Other oxygen-containing gases may also be used in step 503, including ozone ($O_3$). It is noted that the use of ozone in step 503 can result in interfacial oxide layer 603 being thicker and formed more quickly than when the oxygen-containing gas contains only diatomic oxygen. Furthermore, when formed using ozone in step 503, the material properties of interfacial oxide layer 603 may be different than when formed using diatomic oxygen.

In some embodiments, the oxidation treatment of step 503 comprises exposure of surface 602 to a wet oxidation process. In one embodiment, the process comprises performing the so-called "SC-1" process on substrate 201 and surface 602. The SC-1 (standard clean) process generally includes immersion of a substrate in a 1:1:5 solution of ammonium hydroxide ($NH_4OH$), hydrogen peroxide ($H_2O_2$), and water at 75° C. to 80° C. for 10 minutes. When electrode 118 comprises polysilicon, the SC-1 process typically forms an interfacial oxide layer 603 that is approximately 10 Å thick. In embodiments in which a thicker interfacial oxide layer 603 is desired, the duration, temperature, and/or hydrogen peroxide concentration of the SC-1 process may be altered accordingly. In other embodiments, different wet processes may be used to perform the oxidation treatment of step 503. In one embodiment, steps 502 and 503 are completed by using a complete RCA clean process. This is because the RCA clean process is a reliable method of removing native oxide from a silicon substrate, cleaning the substrate of metallic and organic contaminants, and forming a thin oxide of a known thickness on the now clean surface of the silicon substrate.

In one embodiment, the oxidation treatment of step 503 comprises exposure of surface 602 to atmospheric air for a controlled period of time. Specifically, it has been determined that exposure of surface 602 for 30 minutes or more to atmospheric air under standard conditions is suitable to produce a sufficiently thick native oxide that can be used to form variable resistance layer 206. In such an embodiment, step 502 can be omitted, advantageously simplifying the fabrication process. Instead, after electrode 118 is formed on substrate 201 in step 501, substrate 201 is exposed to atmospheric air for at least 30 minutes in step 503. Method 500 then proceeds to step 504. It is noted that in such an embodiment, it may be necessary to select specific materials for electrode 118 and electrode 102 that each have the necessary work function to ensure that variable resistance layer 206 can function as a resistive switching layer. Given a specific native oxide layer that is formed according to such an embodiment, one of skill in the art can readily select suitable materials for electrode 118 and electrode 102 to facilitate the switching functionality of variable resistance layer 206.

In step 504, interfacial oxide layer 603 may optionally undergo additional treatment to further enhance the switching characteristics of variable resistance layer 206.

In one embodiment, a thermal anneal process is performed on interfacial oxide layer 603, such as rapid thermal processing (RTP). It has been demonstrated that the performance of RTP on interfacial oxide layer 603 can significantly improve the switching performance of variable resistance layer 206. Examples of RTP suitable for treatment of interfacial oxide layer 603 in step 504 include rapid thermal oxidation (RTO), rapid thermal nitridization (RTN), and rapid thermal fluoridation (RTF). Temperature and duration of the thermal anneal processes in step 504 is a function of the configuration of memory device 200, including thickness and material composition of interfacial oxide layer 603 and electrode 118. The final anneal process in step 506 may be a single-step, multi-step, and/or ramped process without exceeding the scope of the invention.

Other processes that can be performed in step 504 to enhance interfacial oxide layer 603 include exposure of interfacial oxide layer 603 to a reactive or radicalized nitrogen source. In one embodiment, interfacial oxide layer 603 is exposed to an ammonia ($NH_3$) containing solution. In another embodiment, interfacial oxide layer 603 undergoes decoupled plasma nitridization (DPN) or is exposed to a nitrogen plasma.

Still other processes that can be performed in step 504 to enhance interfacial oxide layer 603 include exposure of interfacial oxide layer 603 to a reactive or radicalized oxygen source. In one embodiment, interfacial oxide layer 603 is exposed to an oxygen plasma. In another embodiment, interfacial oxide layer 603 is exposed to an ozone soak in an atomic layer deposition (ALD) chamber. It is noted that the latter embodiment is particularly advantageous when electrode 118 is also formed via an ALD process, since the enhancement of interfacial oxide layer 603 in step 504 may be performed in situ, i.e., in the same chamber that forms electrode 118 in step 501.

The processes described above for step 504 can potentially generate additional oxygen vacancies or other defects in interfacial oxide layer 603, and thereby reduce switching voltage and switching current of memory device 200.

In step 505, electrode 102 is formed on interfacial oxide layer 603 (illustrated in FIG. 6E) using one or more of the materials suitable for electrode 102 listed above in conjunction with FIG. 4. In some embodiments, electrode 102 is formed directly on variable resistance layer 206 as shown in FIG. 4. In other embodiments, electrode 102 is formed on one or more intervening layers formed on variable resistance layer 206. Electrode 102 may be formed using a deposition process, such as a PVD, CVD, ALD or other similar process. In one embodiment, electrode 102 is between about 500 Å and 1 μm thick.

In some embodiments, electrode layer 102 is formed directly on interfacial oxide layer 603 and includes one or more chemical elements that subsequently diffuse into interfacial oxide layer 603 during an anneal process. For example, in some embodiments, electrode 102 includes the chemical elements titanium, tantalum, and/or nitrogen, so that said chemical elements diffuse into interfacial oxide layer 603 during thermal anneal to form variable resistance layer 206. In this way, variable resistance layer 206 includes an interfacial metal oxide layer (e.g., TiOx, TiSiOx, TaOx, TaSiOx, or combinations thereof). In some embodiments, variable resistance layer 206 is instead formed from other interfacial metal oxide layers. In such embodiments, electrode 102 is formed from the appropriate chemical element or elements that ultimately form the desired interfacial metal oxide layer.

Figure 6F:
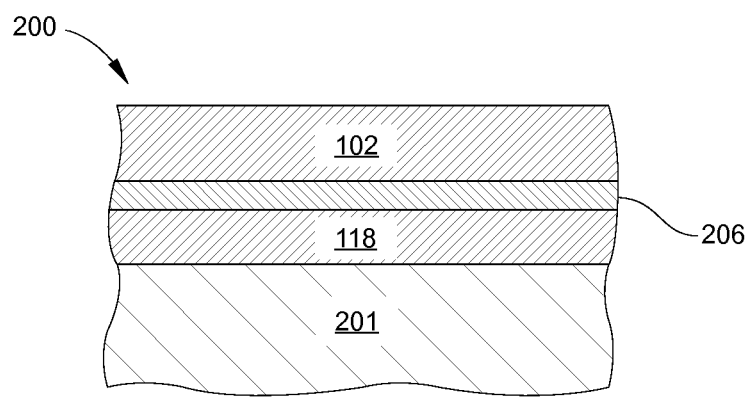

In step 506, an optional final thermal anneal process is performed on electrodes 102 and 118 and interfacial oxide layer 603, to form variable resistance layer 206 (illustrated in FIG. 6F). In one embodiment, an RTN process is performed in step 506 at 750° C. for approximately 1 minute. In other embodiments, other RTP processes may be used as the optional final thermal anneal process in step 506. Temperature and duration of the anneal process of step 506 is a function of the configuration of memory device 200, including thickness and material composition of the various layers of memory device 200. In addition, the final anneal process in step 506 may be a single-step, multi-step, and/or ramped process without exceeding the scope of the invention. It is noted that the final thermal anneal process of step 506 is particularly advantageous for embodiments in which an interfacial metal oxide is desired for variable resistance layer 206.

In step 507, conventional masking and etching processes known in the art are used to form memory element 200 as illustrated in FIG. 4.

One of skill in the art will appreciate that variable resistance layer 206 is formed in method 500 without the use of a dedicated deposition process. Instead, according to embodiments of the invention, variable resistance layer 206 can be formed from interfacial oxide layer 603 using simple oxidation removal and oxidation formation processes, such as easily controlled wet processes and atmospheric pressure processes. Consequently, fabrication of memory device 200 is greatly simplified with respect to prior art memory devices, and requires fewer vacuum deposition steps. Furthermore, memory device 200, formed according to embodiments of the invention, has demonstrated superior switching characteristics compared to conventional resistive memory devices. Specifically, a memory device substantially similar to memory device 200 and formed with an SC-1 oxidation treatment in step 503 and a 750° C., 1 minute RTP anneal in step 504 has a transient set current of 40 micro amps, compared to a transient set current of 50 to 70 micro amps for a memory device using a typical hafnium oxide (HfO$_x$) host oxide layer.

While embodiments of the invention are described herein in terms of resistive switching memory elements that are used to form memory arrays, embodiments of the present invention can be applied to other resistive memory devices without deviating from the basic scope of the invention described herein.

In sum, embodiments of the invention provide a nonvolatile resistive memory element with a host oxide formed from an interfacial oxide layer and methods of forming the same. Advantages of the invention include a memory device with superior switching performance that can be manufactured without using a vacuum deposition process to form the variable resistance layer.

While the foregoing is directed to embodiments of the present invention, other and further embodiments of the invention may be devised without departing from the basic scope thereof, and the scope thereof is determined by the claims that follow.

We claim:

1. A method of forming a nonvolatile memory element, the method comprising:
    forming a first layer operable as an electrode layer of the nonvolatile memory element;
    forming a variable resistance layer comprising an interfacial oxide layer on a surface of the first layer by treating the surface of the first layer with an oxidation treatment,
        wherein the interfacial oxide layer formed by the oxidation treatment,
        wherein the interfacial oxide layer comprises a metal oxide containing layer,
        wherein the metal oxide containing layer has a thickness of less than 20 angstroms,
    treating the interfacial oxide layer; and
    after treating the interfacial oxide layer, depositing a second layer above the interfacial oxide layer,
    wherein the second layer is operable as an electrode layer of the nonvolatile memory element.

2. The method of claim 1, wherein the oxidation treatment comprises a process from the group consisting of a wet oxidation process, exposing the surface to ozone (O$_3$), and exposing the surface to an oxygen-containing atmosphere under controlled conditions for a predetermined time period.

3. The method of claim 2, wherein the wet oxidation process comprises an SC-1 process.

4. The method of claim 1, further comprising removing a native oxide layer from the surface prior to forming the interfacial oxide layer on the surface.

5. The method of claim 4, wherein removing the native oxide layer from the surface comprises one of the group of processes consisting of plasma etching the native oxide layer, exposing the native oxide layer to a hydrofluoric acid containing vapor, and applying a hydrofluoric acid containing solution to the surface.

6. The method of claim 1, wherein treating the interfacial oxide layer comprises one of the group of processes consisting of rapid thermal processing, decoupled plasma nitridization, exposing the interfacial oxide layer to an ammonia (NH$_3$) containing solution, exposing the interfacial oxide layer to a nitrogen plasma, exposing the interfacial oxide layer to an oxygen plasma, and exposing the interfacial oxide layer to an ozone soak in an atomic layer deposition chamber.

7. The method of claim 1, further comprising thermally annealing the first layer, the second layer, and the interfacial oxide layer after depositing the second layer.

8. The method of claim 1, wherein the second layer is formed adjacent to the interfacial oxide layer and comprises a chemical element from the group consisting of tantalum (Ta), titanium (Ti), and nitrogen (N).

9. The method of claim 1, wherein the metal oxide containing layer comprises a material from the group consisting of TiOx, TiSiOx, TaOx, TaSiOx, and a combination thereof.

10. The method of claim 1, wherein the variable resistance layer of the nonvolatile memory element is configured to be switched between two or more resistive states.

11. The method of claim 1, wherein the first layer comprises titanium nitride.

12. The method of claim 1, wherein the first layer comprises one of titanium nitride, tantalum nitride, titanium, tantalum, or a transition metal alloy.

13. The method of claim 7, wherein thermally annealing of the first layer, the second layer, and the interfacial oxide layer after depositing the second layer comprises transferring one or more chemical elements from the second layer into the interfacial oxide layer.

14. The method of claim 13, wherein the one or more chemical elements comprises at least one of titanium, tantalum, or nitrogen.

15. The method of claim 1, wherein the oxidation treatment comprises exposing the surface of the first layer to atmospheric air.

16. The method of claim 1, wherein treating the interfacial oxide layer comprises decoupled plasma nitridization.

17. The method of claim 1, wherein treating the interfacial oxide layer comprises exposing the interfacial oxide layer to an ammonia ($NH_3$) containing solution.

18. The method of claim 1, wherein treating the interfacial oxide layer generates additional oxygen vacancies in the interfacial oxide layer.

19. The method of claim 1, wherein the second layer directly interfaces the interfacial oxide layer.

20. The method of claim 1, wherein a thickness of the interfacial oxide layer is controlled by controlled by controlling temperature, oxygen concentration, and duration of the oxidation treatment.

* * * * *